United States Patent
Hirayama et al.

(10) Patent No.: US 7,888,154 B2
(45) Date of Patent: Feb. 15, 2011

(54) OPTICAL SEMICONDUCTOR DEVICE AND MANUFACTURING METHOD THEREFOR

(75) Inventors: Hideki Hirayama, Saitama (JP);
Tomoaki Ohashi, Saitama (JP);
Norihiko Kamata, Saitama (JP)

(73) Assignee: Riken (JP)

( * ) Notice: Subject to any disclaimer, the term of this patent is extended or adjusted under 35 U.S.C. 154(b) by 0 days.

(21) Appl. No.: 12/704,135

(22) Filed: Feb. 11, 2010

(65) Prior Publication Data
US 2010/0144078 A1 Jun. 10, 2010

Related U.S. Application Data

(63) Continuation of application No. 12/055,977, filed on Mar. 26, 2008, now abandoned.

(30) Foreign Application Priority Data
Aug. 27, 2007 (JP) .............................. 2007-219910

(51) Int. Cl.
H01L 33/00 (2010.01)
H01L 21/00 (2010.01)

(52) U.S. Cl. ........................... 438/47; 438/46; 438/478; 438/775; 257/86; 257/E33.001; 257/E33.013; 257/E21.001

(58) Field of Classification Search .............. 257/9, 257/11, 86, 132, E33.013, E33.05, E33.001, 257/E21.001; 438/22, 40, 46, 47, 478, 775
See application file for complete search history.

(56) References Cited

U.S. PATENT DOCUMENTS 5,834,331 A 11/1998 Razeghi (Continued)

FOREIGN PATENT DOCUMENTS

JP 9-64477 A 3/1997

(Continued)

OTHER PUBLICATIONS

Yoshikawa, A., et al., "A New "Three-Step Method" for High Quality MOVPE Growth of III-Nitrides on Sapphire," Phys. Stat. Sol. (a) 188, No. 2, pp. 625-628, Jul. 12, 2001.

(Continued)

Primary Examiner—Victor Mandala
Assistant Examiner—Whitney Moore
(74) Attorney, Agent, or Firm—Lando & Anastasi, LLP

(57) ABSTRACT

To provide an elemental technique for improving the emission intensity of deep ultraviolet light from a light emitting layer made of an AlGaInN-based material, in particular, an AlGaN-based material. First, an AlN layer is grown on a sapphire surface. The AlN layer is grown under a $NH_3$-rich condition. The TMAl pulsed supply sequence includes growing an AlGaN layer for 10 seconds, interrupting the growth for 5 seconds to remove $NH_3$, and then introducing TMAl at a flow rate of 1 sccm for 5 seconds. After that, the growth is interrupted again for 5 seconds. Defining this sequence as one growth cycle, five growth cycles are carried out. By such growth, an AlGaN layer having a polarity of richness in Al can be obtained. The above sequence is described only for illustrative purposes, and various variations are possible. In general, the Al polarity can be achieved by a process of repeating both growth interruption and supply of an Al source.

7 Claims, 12 Drawing Sheets

U.S. PATENT DOCUMENTS

| | | |
|---|---|---|
| 6,865,005 B2 | 3/2005 | Aoki et al. |
| 7,141,961 B2 | 11/2006 | Hirayama et al. |
| 7,244,385 B2 | 7/2007 | Aoki et al. |
| 7,294,867 B2 | 11/2007 | Akita et al. |
| 7,309,394 B2 | 12/2007 | Hirayama et al. |
| 2006/0160345 A1 | 7/2006 | Liu et al. |

FOREIGN PATENT DOCUMENTS

| | | |
|---|---|---|
| JP | 11111617 | 4/1999 |
| JP | 2004-228489 | 8/2004 |
| JP | 2008078613 | 4/2008 |

OTHER PUBLICATIONS

Zang, et al., "High Quality AlGaN Layers over Pulsed Atomic-Layer Epitaxially Grown AlN Templates for Deep Ultraviolet Light-Emitting Diodes," 2003 Journal of Electronic Materials, vol. 32, pp. 364-370.

Hirayama, et al., "Growth and Optical Properties of III-nitride semiconductors for Deep UV (230-350nm) Light-Emitting Diodes (LEDs) and Laser Diodes (LDs)," Mar. 2001, RIKEN Review No. 33: Focused on Coherent Science, pp. 28-31.

(A) Pulsed supply of TMAl is used (B) Pulsed supply of TMAl is not used (A)

10 μm

Pulsed supply of TMAl is used (B)

10 μm

Pulsed supply of TMAl is not used

OPTICAL SEMICONDUCTOR DEVICE AND MANUFACTURING METHOD THEREFOR

CROSS-REFERENCE TO RELATED APPLICATIONS

This application is a continuation application of and claims the benefit under 35 U.S.C. §120 to copending U.S. patent application Ser. No. 12/055,977, titled OPTICAL SEMICONDUCTOR DEVICE AND MANUFACTURING METHOD THEREFOR, which was filed on Mar. 26, 2008, which claims priority to Japanese Patent Application No. 2007-219910, titled SEMICONDUCTOR DEVICE AND MANUFACTURING METHOD THEREFOR, which was filed on Aug. 27, 2007, each of which is incorporated herein by reference for all purposes.

BACKGROUND OF THE INVENTION

1. Field of the Invention

The present invention relates to an optical semiconductor device and a manufacturing method therefor. In particular, it relates to a technology of a deep ultraviolet light emitting device using a group III-V compound semiconductor.

2. Background Art

In recent years, in technical fields of semiconductor light emitting devices using PN junction, such as light emitting diodes and laser diodes, nitride semiconductors containing nitrogen as a group-V element have been drawing lots of attention, and research and development thereof have been actively carried out. Nitride semiconductors, such as AlN, GaN and InN, are direct transition semiconductors. Furthermore, a ternary or quaternary mixed crystal is capable of emitting light from infrared rays to deep ultraviolet rays by changing the band gap by appropriately determining the composition.

Furthermore, a semiconductor light emitting device that has a light emitting layer made of AlGaInN as a quaternary mixed crystal and emits ultraviolet rays is drawing attention (see the JP Patent Publication (Kokai) No. 9-64477A (1997)). It has been reported that, although the AlGaInN layer contains In, the AlGaInN layer can have a light emission peak at a wavelength of 360 nm or shorter, and the internal quantum efficiency thereof can be improved to approach that of the InGaN layer.

SUMMARY OF THE INVENTION

However, in manufacturing a semiconductor light emitting device using a nitride semiconductor, it is required to use a sapphire substrate, for example, as an epitaxial growth substrate, because it is difficult, or expensive even if possible, to produce a high-quality and large-area epitaxial growth substrate of a nitride semiconductor. FIG. 14 shows a relationship between the lattice constant and the band gap energy (corresponding to the wavelength) of an InAlGaAs-based quaternary mixed crystal. This drawing also shows the light emitting wavelength of an ultraviolet gas laser. As shown in FIG. 14, in order to manufacture a solid-state light emitting device that emits light at a shorter wavelength, the Al proportion in AlGaN has to be raised to increase the band gap energy. Therefore, the lattice constant deviates from that of the sapphire substrate. As a result, there is a problem that the threading dislocation density of the nitride semiconductor thin film increases because the lattice constant mismatch increases. The threading dislocation causes reduction of the internal quantum efficiency of the semiconductor light emitting device, and therefore, it is necessary to address the problem of the threading dislocation to improve the internal quantum efficiency of the semiconductor light emitting device.

An object of the present invention is to provide an elemental technique for improving the emission intensity of deep ultraviolet light from a light emitting layer made of an AlGaInN-based material, in particular, an AlGaN-based material.

According to an aspect of the present invention, there is provided a semiconductor structure comprising a polarity controlling layer, which is a first group III-V layer formed on a substrate under such a growth condition that the layer is formed to be rich in a group III element, and a second group III-V layer formed on the polarity controlling layer.

Furthermore, a semiconductor structure preferably comprises a polarity controlling layer, which is a first group III nitride layer formed on a sapphire substrate under such a growth condition that the layer is formed to be rich in a group III element, and a third group III nitride layer formed on the polarity controlling layer. Preferably, five or more group-III-rich layers, which are formed by intermittently supplying a group III source, are provided. The group III source is preferably TMAl.

The polarity controlling layer has a structure in which a threading dislocation extending from the bottom turns around in the vicinity of the interface with the first group III-V layer. The semiconductor structure has a high temperature grown AlN layer formed between the substrate and the first group III-V layer. The group III-V crystal layer is made of an InAlGaN-based semiconductor crystal.

The present invention can provide an optical semiconductor device having the semiconductor structure described above. For example, the optical semiconductor device emits light at a wavelength ranging from 250 nm to 350 nm.

According to another aspect of the present invention, there is provided a method of forming a semiconductor structure, comprising a step of preparing a substrate, and a step including a first period in which a group III source and a group V source are supplied to the substrate, a second period in which supply of the group III source and the group V source is stopped, a third period in which only the group III source is supplied and the group V source is not supplied, and a period in which the second and third periods are repeated to control the polarity of the surface to be a group III polarity.

Furthermore, there is provided a method of forming a semiconductor structure, comprising a step of preparing a sapphire substrate, and a step including a first period in which a first Al source, a Ga source, and a N source are supplied to the sapphire substrate, a second period in which supply of all the sources is stopped, a third period in which only a second Al source is supplied, and a period in which the second and third periods are repeated to form a polarity controlling layer having a surface have an Al polarity.

Furthermore, there is provided a method of forming a semiconductor structure, comprising a step of preparing a sapphire substrate, and a step including a first period in which a first Al source, a Ga source, and a N source are supplied to the sapphire substrate, a second period in which supply of all the sources is stopped, a third period in which only a second Al source is supplied, and a period in which the second and third periods are repeated to control the polarity of the surface to be an Al polarity. The method preferably further comprises a step of forming an AlN buffer layer between the sapphire substrate and the polarity controlling layer at high temperature.

The method preferably further comprises a step of forming an optical semiconductor device made of InAlGaA-based material on the polarity controlling layer.

According to the present invention, a high-quality AlGaN buffer for an ultraviolet LED can be produced. The pulsed supply of TMAl enables the group III polarity to be achieved. The pulsed supply of TMAl advantageously reduces the threading dislocation.

Using a template formed of the high-quality AlGaN buffer layer formed by pulsed supply of TMAl substantially improves the maximum power of the ultraviolet LED, compared with the prior art.

DETAILED DESCRIPTION OF THE PREFERRED EMBODIMENTS

Prior to description of an embodiment of the present invention, there will be described considerations of the deep ultraviolet light emitting device by the inventor. The inventor has come to realize that controlling the polarity of group III compounds, such as AlGaN-based compounds, is very important. For example, when AlN is to be grown on a sapphire substrate, the polarity of AlN is unstable, and it is important to control the polarity of AlN to be the stable group III polarity. The inventor has found that the stable group III polarity can be achieved by pulsed supply of TMAl.

Figure 1:
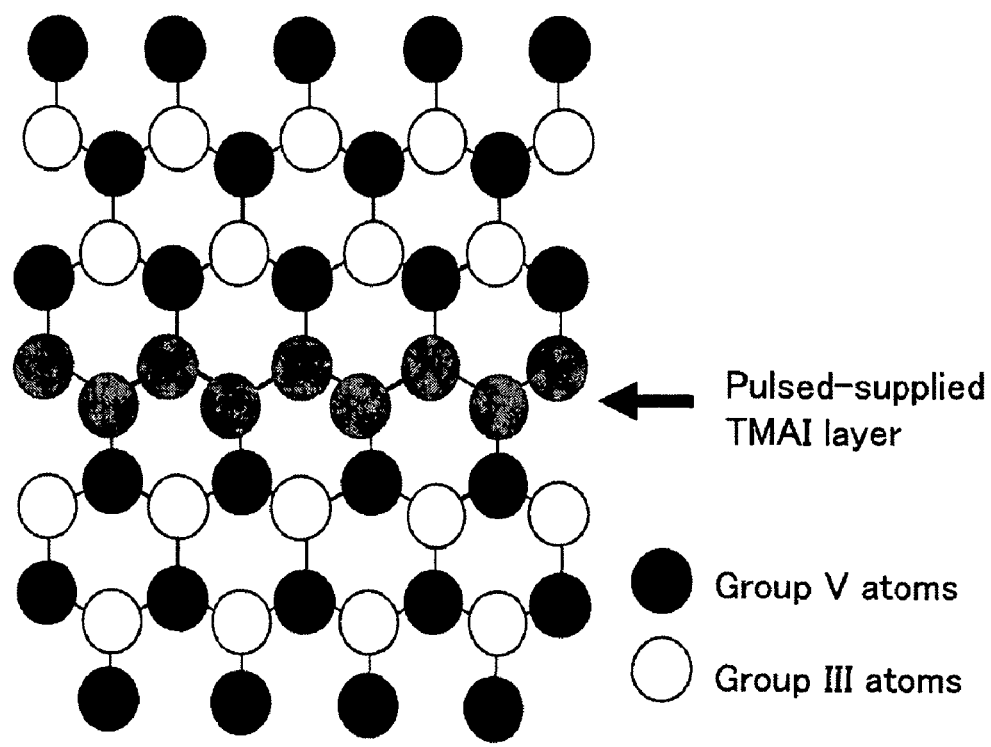
FIG. 1 is a cross-sectional view showing an atomic structure composed of group III atoms and group V atoms formed on a sapphire substrate.

In the following, an optical semiconductor device and a manufacturing method therefor according to an embodiment of the present invention will be described with reference to the drawings. FIG. 1 is a cross-sectional view showing an atomic structure composed of group III atoms and group V atoms formed on a sapphire substrate. As shown in FIG. 1, a pulsed-supplied TMAl layer is built into a sample having the group V polarity, to form an Al-rich layer, thereby inverting the polarity to the group III polarity. In this way, the surface can be made to have the group III polarity and stabilized.

Next, a semiconductor structure the polarity of which is controlled and a growth method therefor will be described. FIGS. 2(A) and 2(B) are diagrams showing a structure formed by using pulsed supply of TMAl and a structure formed without using pulsed supply of TMAl, respectively. The structure shown in FIG. 2(A) comprises a sapphire (0001) substrate 1, an HT-AlN layer 3 formed on the sapphire (0001) substrate 1, an alternate lamination 5 of AlGaN layers and pulsed-supplied TMAl layers formed on the HT-AlN layer 3, and an AlGaN layer 7. On the other hand, the structure shown in FIG. 2(B) comprises a sapphire (0001) substrate 1, an AlN layer 3 formed on the sapphire (0001) substrate 1, and an AlGaN layer 11 formed on the AlN layer 3. That is, the structure shown in FIG. 2(B) does not have the alternate lamination 5 of AlGaN layers and pulsed-supplied TMAl layers. The alternate lamination 5 of AlGaN layers and pulsed-supplied TMAl layers serves as a polarity controlling layer for controlling the surface polarity to be the group III polarity. The abbreviation "HT-AlN" refers to High Temperature AlN, which means AlN grown at high temperature. The phrase "high temperature" used herein means 1100 or higher degrees C. In this embodiment, the HT-AlN layer is grown at 1270 degrees C.

TABLE 1

| AlGaN & pulsed-supplied TMAl layer | | |
|---|---|---|
| Growth temperature: | 1270° C. | |
| Growth pressure: | 76 Torr | |
| Flow rate | TMG | 1 sccm |
| | TMAl | 50 sccm |
| | NH3 | 40 sccm |
| | Pulsed-supplied TMAl | 1 sccm |

Table 1 shows growth conditions of AlGaN and pulsed-supplied TMAl. As shown in Table 1, for example, a horizontal low-pressure MOCVD apparatus is used, the growth temperature is set at 1270 degrees C., the pressure during growth is set at 76 Torr (133.32 Pa=1 Torr), the flow rate of supply of TMG is 1 sccm (1 sccm=1.667×10$^{-5}$ l/s), the flow rate of supply of TMAl is 50 sccm, the flow rate of supply of HN$_3$ is 40 sccm, and the flow rate of supply of pulsed-supplied TMAl is 1 sccm.

Figure 2:
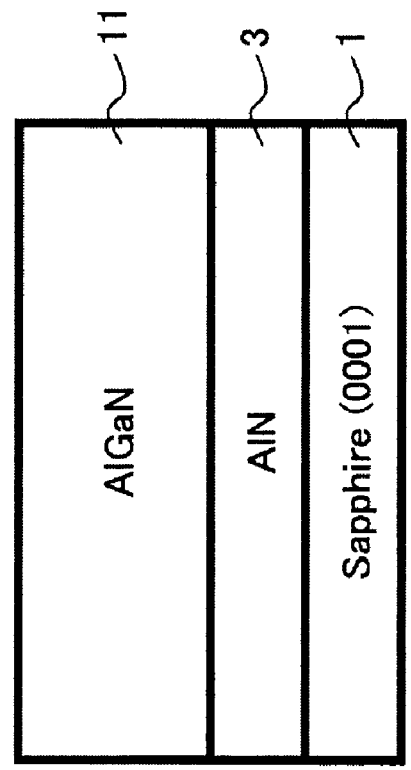
FIGS. 2(A) and 2(B) are diagrams showing a structure formed by using pulsed supply of TMAl and a structure formed without using pulsed supply of TMAl, respectively.
Figure 2:
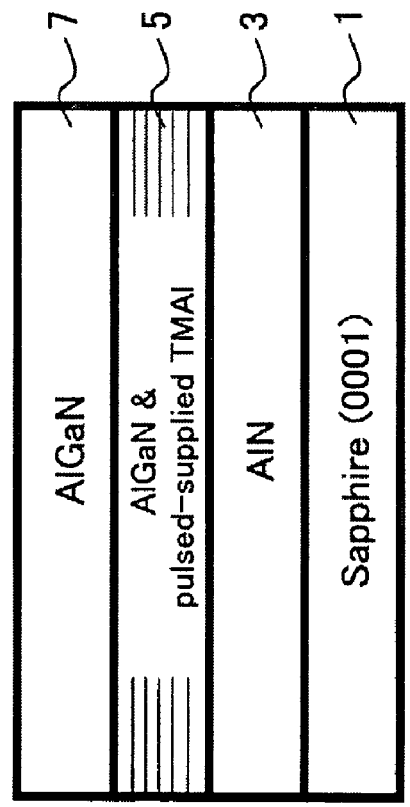
Figure 7:
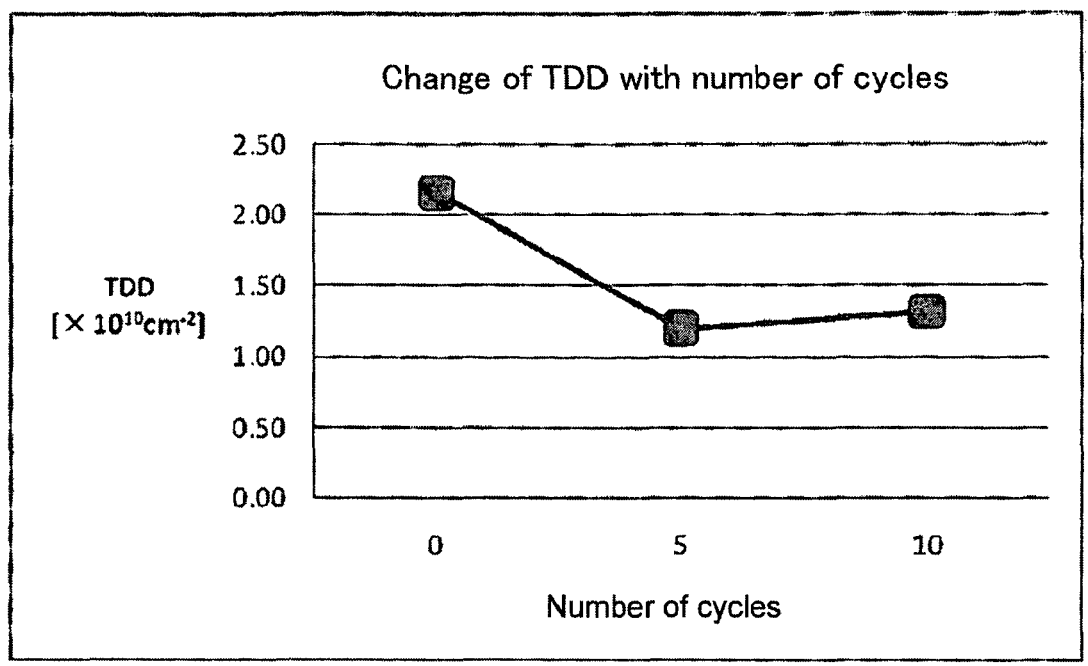
FIG. 7 is a diagram showing the dependence of TDD, which corresponds to the threading dislocation, on the number of cycles of TMAl layer growth.
Figure 9:
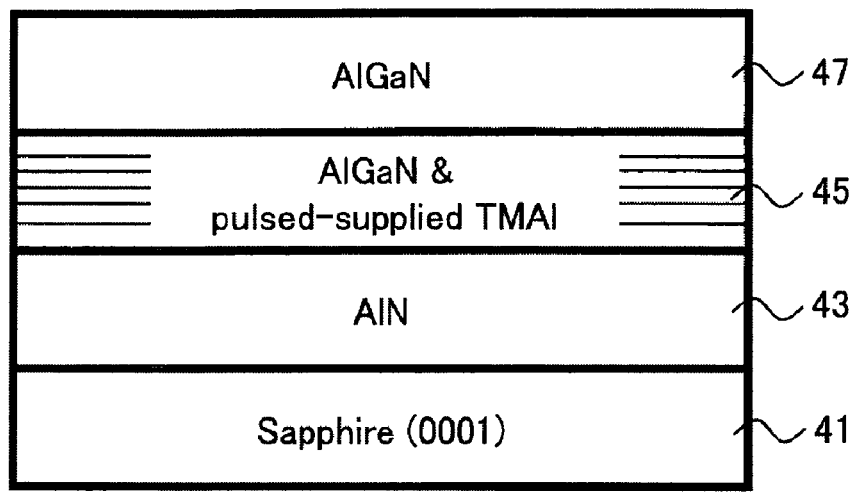
FIG. 9 is a diagram showing an exemplary configuration of a semiconductor structure according to the embodiment.

For details of the MOCVD apparatus used, refer to FIGS. 2, 7 and 9 and descriptions concerning the drawings of JP Patent Publication (Kokai) 2004-228489A, which is issued to the inventors. Detailed descriptions thereof will be omitted herein.

Figure 3:
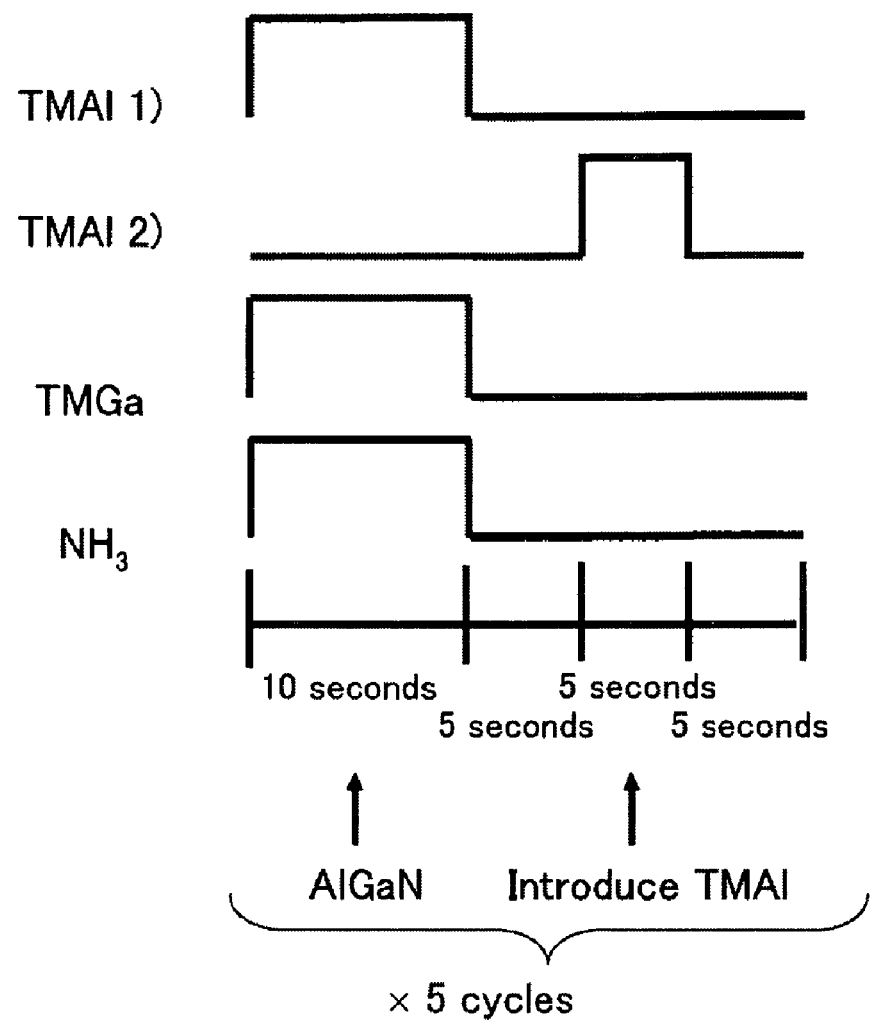
FIG. 3 is a sequence diagram for growth of a TMAl layer.

FIG. 3 is a sequence diagram for growth of a TMAl layer. Referring to the sequence diagram of FIG. 3, the AlN layer 3 is first grown on the sapphire substrate 1. The AlN layer 3 is grown under a NH$_3$-rich condition. For example, a TMAl pulse supply sequence includes growing an AlGaN layer for 10 seconds, interrupting the growth for 5 seconds to remove NH$_3$, and then introducing TMAl at a flow rate of 1 sccm for 5 seconds. After that, the growth is interrupted again for 5 seconds. Defining this sequence as one growth cycle, five growth cycles are carried out. By such growth, an AlGaN layer having a polarity of richness in Al can be obtained. The above sequence is described only for illustrative purposes, and various variations are possible. In general, the Al polarity can be achieved by a process of repeating both growth interruption and supply of an Al source. The methods for growth interruption may include significant reduction in flow rate of $NH_3$.

Figure 4:
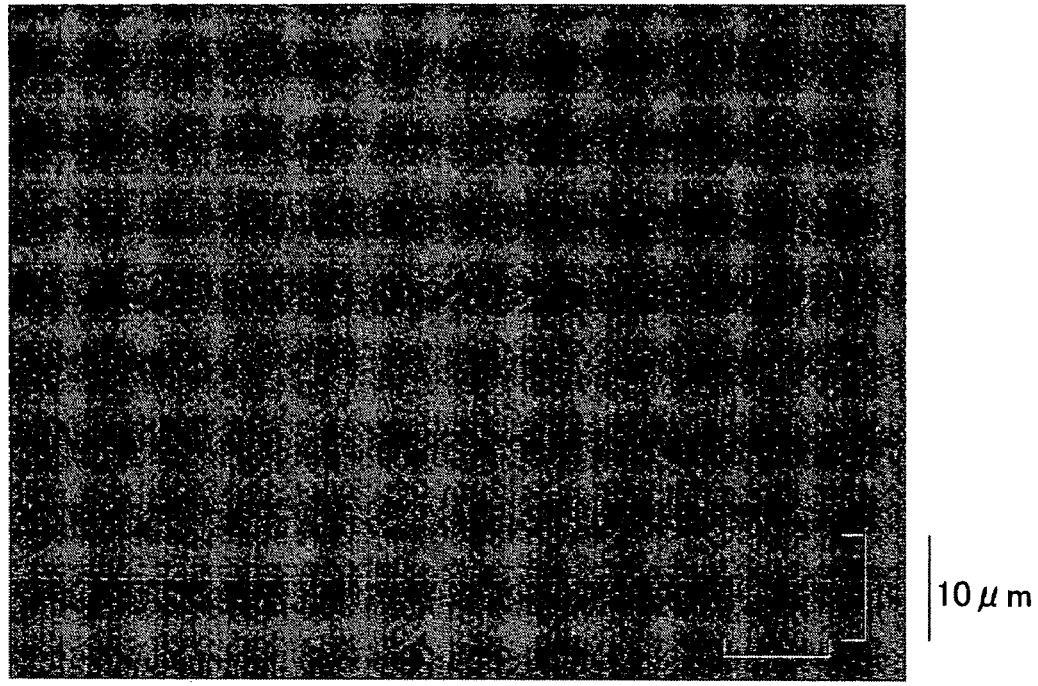
FIGS. 4(A) and 4(B) are photographs of the surfaces of structures corresponding to those shown in FIGS. 2(A) and (B), observed with an optical microscope, respectively.
Figure 4:
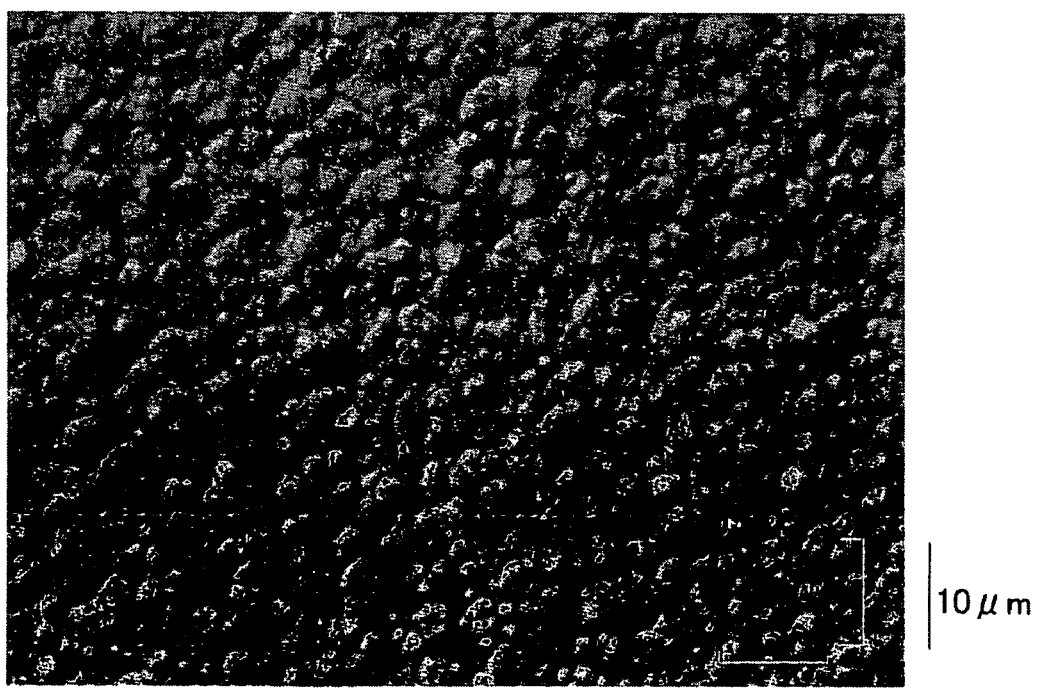

FIGS. 4(A) and 4(B) are photographs of the surfaces of structures corresponding to those shown in FIGS. 2(A) and (B), observed with an optical microscope, respectively. The surface morphology is significantly better in FIG. 4(A), and thus, it is verified that the pulsed supply of TMAl helps achieve the group III polarity. In addition, it is verified that a smooth group III polarity surface, rather than a rough group V polarity surface, can be formed if the surface of the two samples is treated with KOH for 10 minutes.

Figure 5:
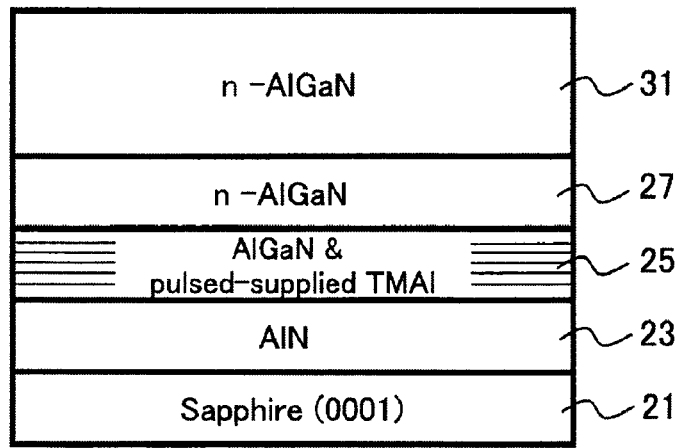
FIG. 5 is a cross-sectional view showing an exemplary configuration of a semiconductor structure according to an embodiment of the present invention.

Next, a technique of reducing the threading dislocation in the AlGaN layer will be described. FIG. 5 is a cross-sectional view showing an exemplary configuration of a semiconductor structure according to this embodiment. The semiconductor structure shown in FIG. 5 comprises a sapphire substrate 21, an AlN layer 23, an AlGaN/pulsed-supplied TMAl layer 25, an n-type AlGaN layer 27 and an n-type AlGaN layer 31.

TABLE 2

Growth conditions of AlGaN & pulsed-supplied TMAl layer

| Growth temperature: | 1270° C. | |
|---|---|---|
| Growth pressure: | 76 Torr | |
| Flow rate | TMG | 1 sccm |
| | TMAl | 50 sccm |
| | $NH_3$ | 40 sccm |
| | Pulsed-supplied TMAl | 1 sccm |

Table 2 shows growth conditions of AlGaN and pulsed-supplied TMAl layer, which are the same as those shown in Table 1.

Figure 6:
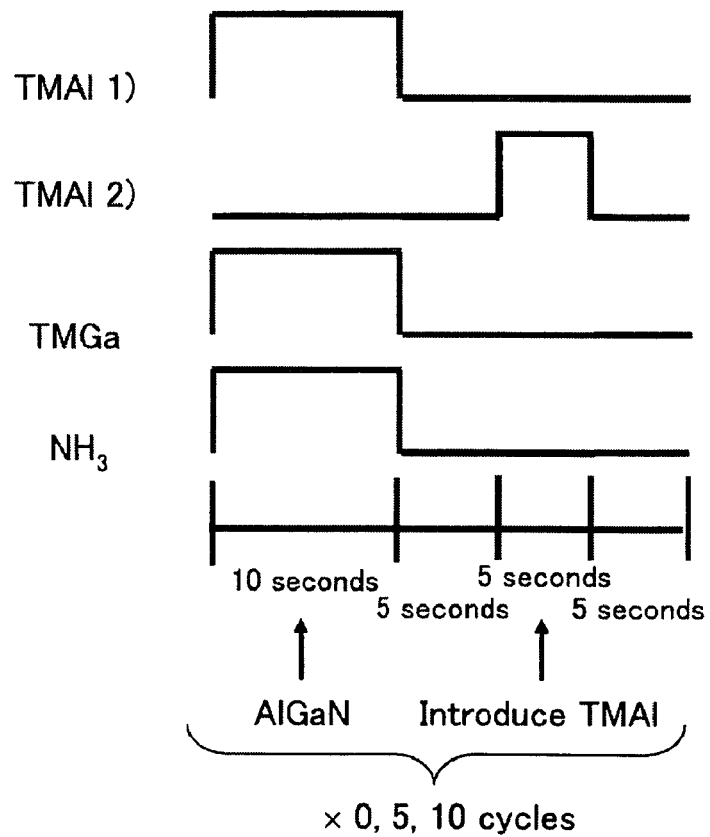
FIG. 6 is a sequence diagram for an experiment to examine the dependence of the threading dislocation on the number of cycles of pulsed supply of TMAl, in which sequence the TMAl layer growth sequence shown in FIG. 3 is carried out for 0 cycles, 5 cycles and 10 cycles.

FIG. 6 is a sequence diagram for an experiment to examine the dependence of the threading dislocation on the number of cycles of pulsed supply of TMAl, in which sequence the TMAl layer growth sequence shown in FIG. 3 is carried out for 0 cycles, 5 cycles and 10 cycles. FIG. 7 is a diagram showing the dependence of TDD, which corresponds to the threading dislocation, on the number of cycles of TMAl layer growth, in the case where the growth has been carried out according to the sequence diagram of FIG. 6. As shown in FIG. 7, if the number of cycles of pulsed supply of TMAl is about five or more, the threading dislocation density is reduced to about half.

Figure 8A:
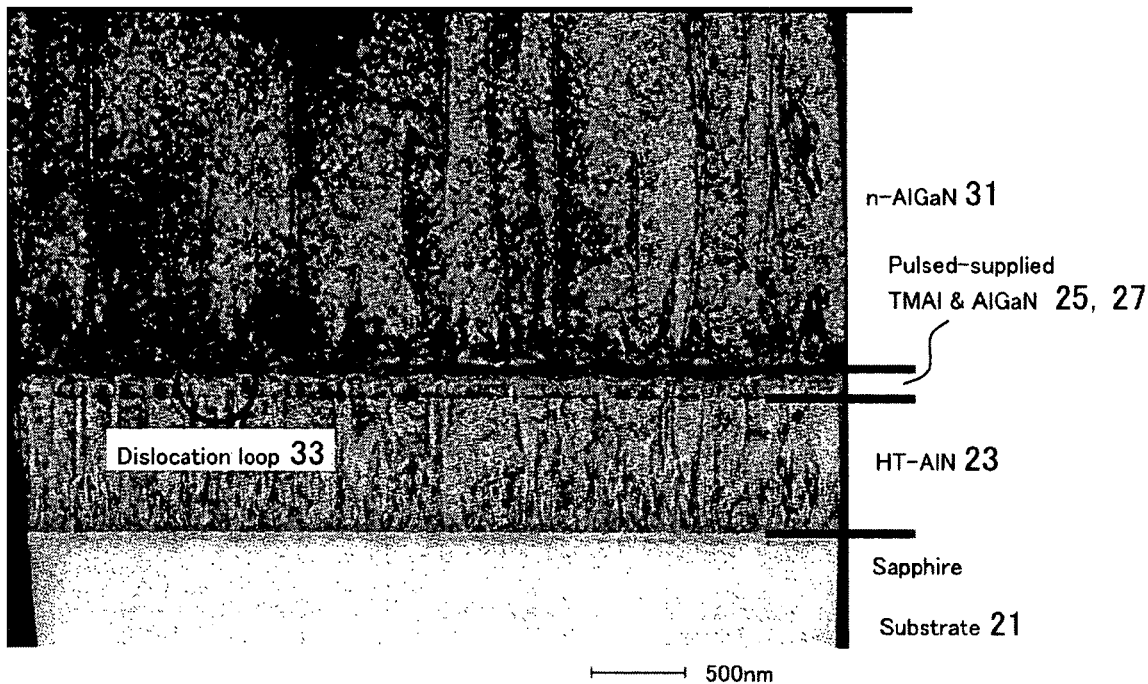
FIG. 8A is a cross-sectional TEM photograph of the structure shown in FIG. 5.
Figure 8B:
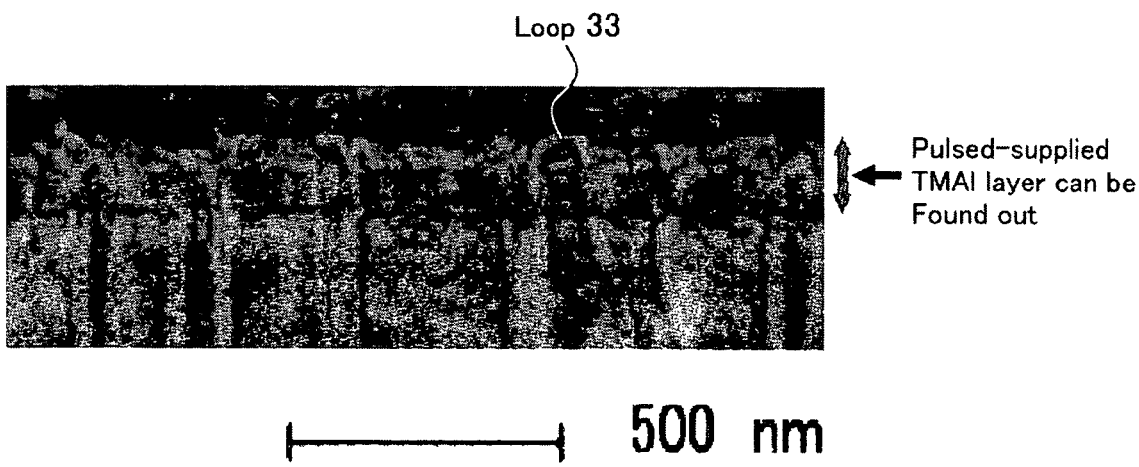
FIG. 8B is a partially enlarged view of the photograph of FIG. 8A.

FIGS. 8A and 8B are cross-sectional TEM photographs of the structure shown in FIG. 5. As shown in FIG. 8A, the HT-AlN layer 23, the pulsed-supplied TMAl layer and AlGaN layer 25 and 27, and the n-AlGaN layer 31 are stacked on the sapphire substrate 21. As can be seen also from the enlarged view of FIG. 8B, the threading dislocation formed in the HT-AlN layer 23 on the sapphire substrate 21 forms a loop 33 in the pulsed-supplied TMAl layer and AlGaN layer 25 and 27 (which is observed as a superlattice layer) (turns around rather than extends into the n-AlGaN layer 31) and returns into the HT-AlN layer 23. It can also be seen that this loop configuration significantly reduces the threading dislocation density in the n-AlGaN layer 31 disposed above. In addition, from the surface observation, it can be seen that by introduction of the TMAl layer, the surface morphology is improved, and the surface is controlled to be the stable Ga (group III) polarity.

In the following, the dependence of the threading dislocation on the interval between pulsed supplies of TMAl will be described. FIG. 9 is a diagram showing an exemplary configuration of a semiconductor structure. As shown in FIG. 9, an AlN layer 43 is grown on a sapphire substrate 41, an AlGaN/TMAl layer 45 is grown on the AlN layer 43, and an AlGaN layer 47 is grown on the AlGaN/TMAl layer 45. As shown in Table 3, the growth conditions are the same as those shown in Tables 1 and 2.

TABLE 3

Growth conditions of AlGaN & pulsed-supplied TMAl layer

| Growth temperature: | 1270° C. | |
|---|---|---|
| Growth pressure: | 76 Torr | |
| Flow rate | TMG | 1 sccm |
| | TMAl | 50 sccm |
| | $NH_3$ | 40 sccm |
| | Pulsed-supplied TMAl | 1 sccm |

Figure 10:
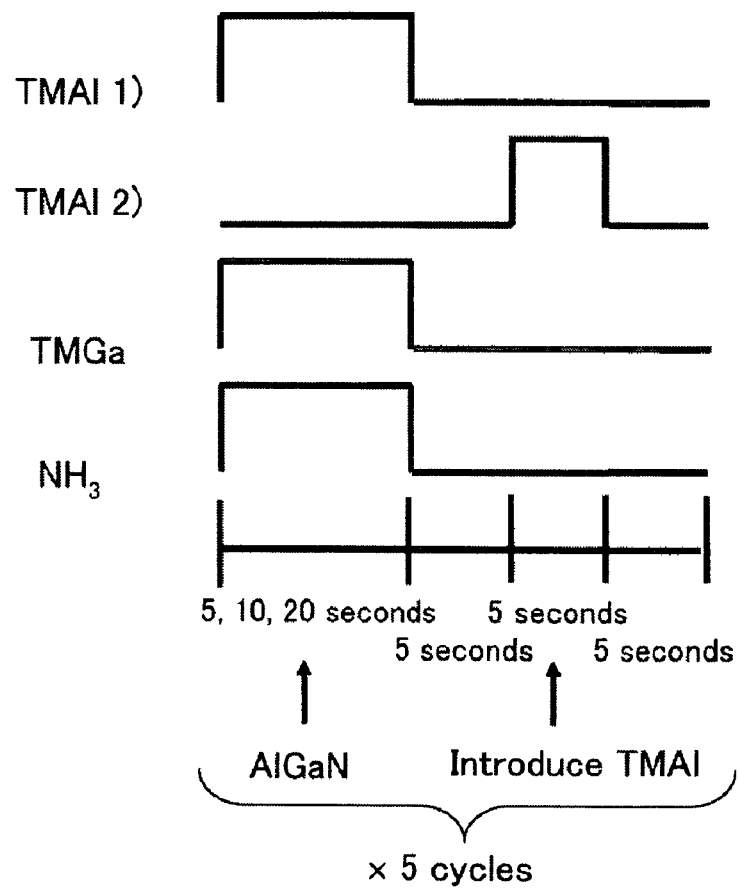
FIG. 10 is a sequence diagram for illustrating growth of the semiconductor structure shown in FIG. 9.
Figure 11:
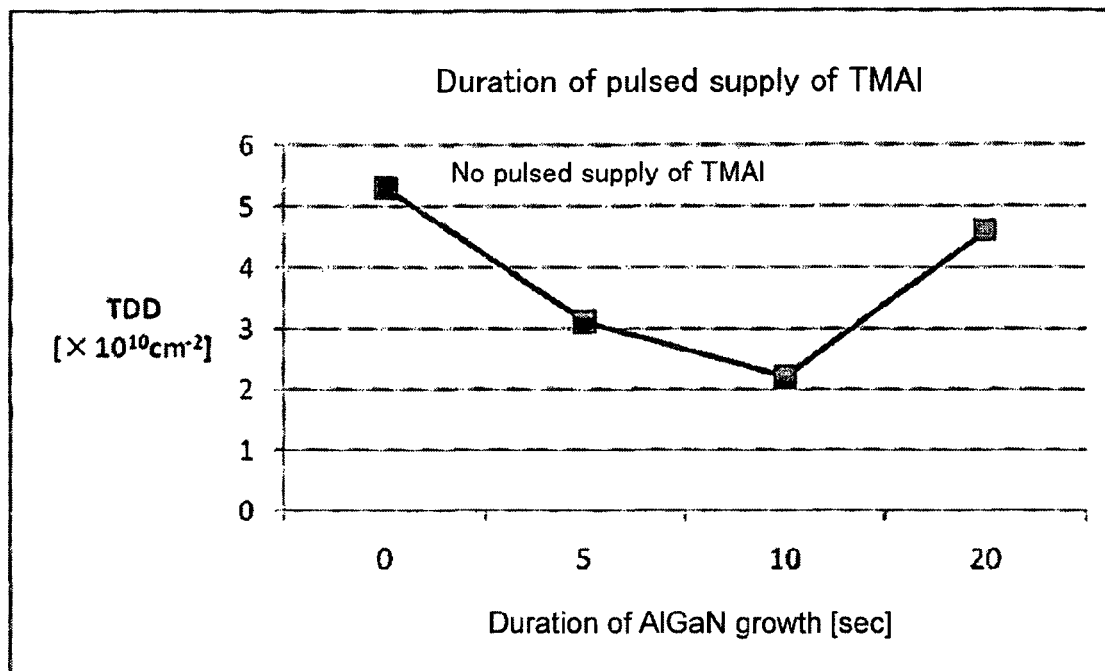
FIG. 11 is a diagram showing the dependence of the threading dislocation density TDD on the duration of AlGaN growth.

FIG. 10 is a sequence diagram for illustrating growth of the semiconductor structure shown in FIG. 9. This drawing shows an example in which the sequence of TMAl introduction is not changed, and AlGaN is supplied for various lengths of time, specifically, 5 seconds, 10 seconds and 20 seconds. In such a case, as shown in FIG. 11, the dependence of the threading dislocation density TDD on the duration of AlGaN growth is minimized when the duration is about 10 seconds, and the threading dislocation density is minimized when the duration of AlGaN growth is about 10 seconds.

The threading dislocation described above can be summarized as follows.

1) The threading dislocation density is reduced by pulsed supply of TMAl (for example, 5 or 10 cycles).

2) The threading dislocation density is minimized when the interval between pulsed supplies of TMAl is about 10 seconds. The reason why the threading dislocation density is reduced can be considered to be because threading dislocations are bent due to the difference in lattice constant between the pulsed-supplied TMAl layer and the AlGaN layer, and threading dislocations close to each other collide with each other and disappear.

As for the dependence of the threading dislocation on the number of growth cycles, although some periodic structure is needed to reduce the dislocation, it is estimated that the effect of the dislocation reduction by such structure is saturated when the number of growth cycles reaches a certain value. This can be considered to be because threading dislocations close to each other collide with each other and disappear.

Furthermore, the reason why there is an optimal value of the interval between pulsed supplies of TMAl can be considered to be because the lattice constant changes much abruptly to disturb the crystal structure when the AlGaN growth duration is 5 seconds, and the lattice constant change occurs over a long distance and dislocations are bent insufficiently when the AlGaN growth duration is 20 seconds.

In the following, there will be described a technique of forming an LED on a template produced according to the TMAl supply technique described above.

Figure 12:
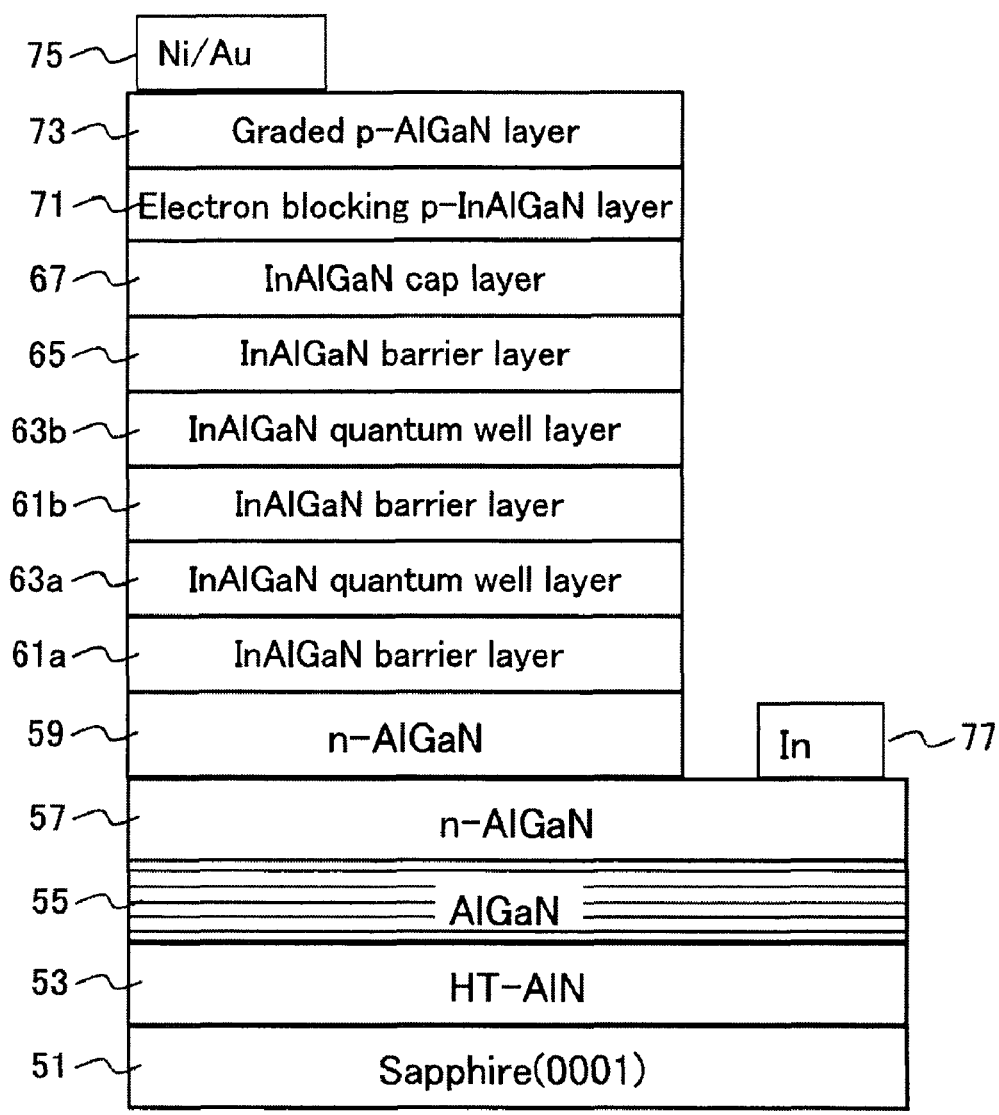
FIG. 12 is a schematic cross-sectional view showing a pulsed-supplied TMAl structure and an LED element formed thereon.

FIG. 12 is a schematic cross-sectional view showing the pulsed-supplied TMAl structure described above and an LED element formed thereon. As shown in FIG. 12, on a sapphire substrate 51, there is formed a pulsed-supplied TMAl structure comprising an HT-AlN layer 53, a pulsed-supplied TMAl/AlGaN layer 55, and an n-AlGaN layer 57 that are stacked in this order. An n-AlGaN layer 59 is formed on the pulsed-supplied TMAl structure, a quantum well structure comprising a plurality of pairs of InAlGaN barrier layer 61*a* and InAlGaN quantum well layer 63*a* is formed on the n-AlGaN layer 59, an InAlGaN cap layer 67 is formed on an InAlGaN barrier 65 formed on the top of the quantum well structure, a p-InAlGaN electron blocking layer 71 is formed on the InAlGaN cap layer 67, and a p-AlGaN composition graded layer 73 is formed on the p-InAlGaN electron blocking layer 71. Furthermore, an In electrode 77 is formed on the n-AlGaN layer 57, and a Ni/Au electrode 75 is formed on the p-AlGaN composition graded layer 73. Such a quantum well structure and the p-n junction form an LED element. The LED element is expected to have preferable characteristics because the polarity is controlled and the threading dislocation density is reduced as described above.

Figure 13:
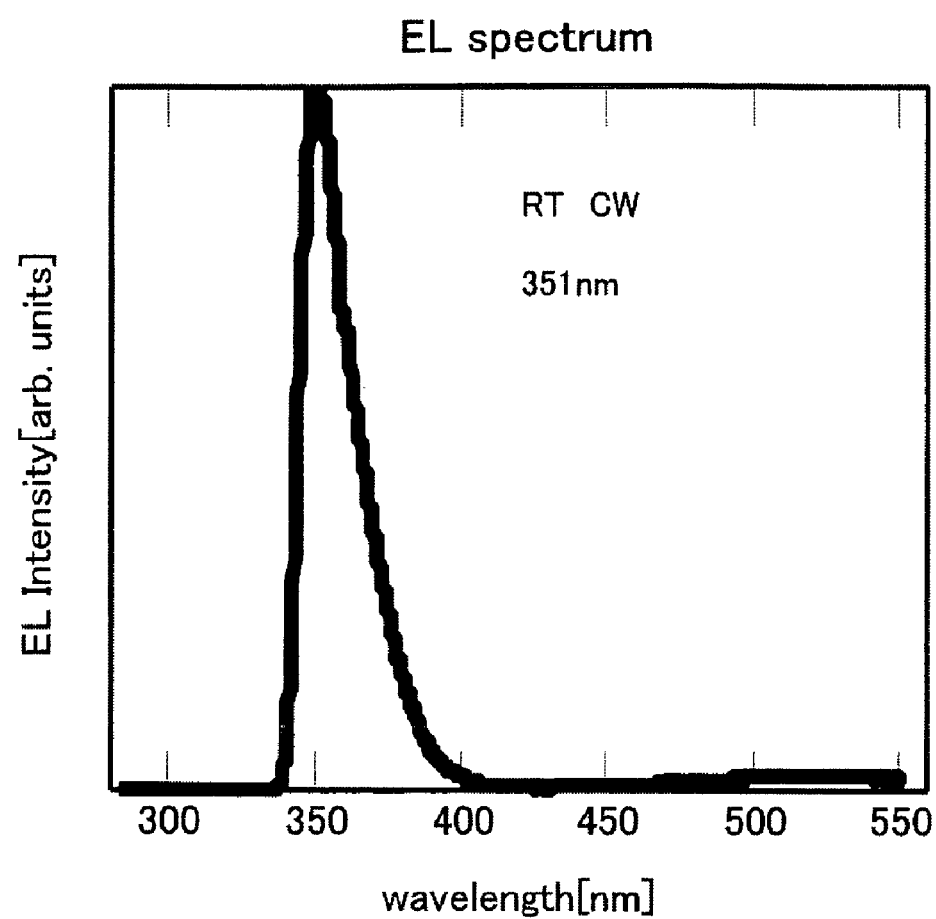
FIG. 13 shows an EL spectrum characteristic of the LED element.
Figure 14:
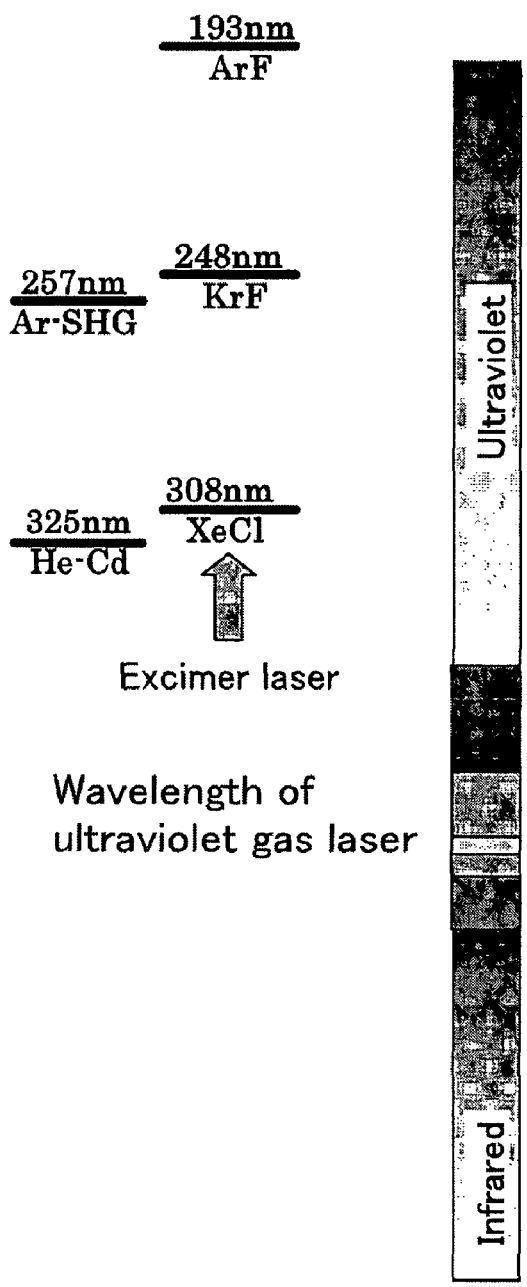
FIG. 14 shows a relationship between the lattice constant and the band gap energy (corresponding to the wavelength) of an InAlGaAs-based quaternary mixed crystal.
Figure 14:
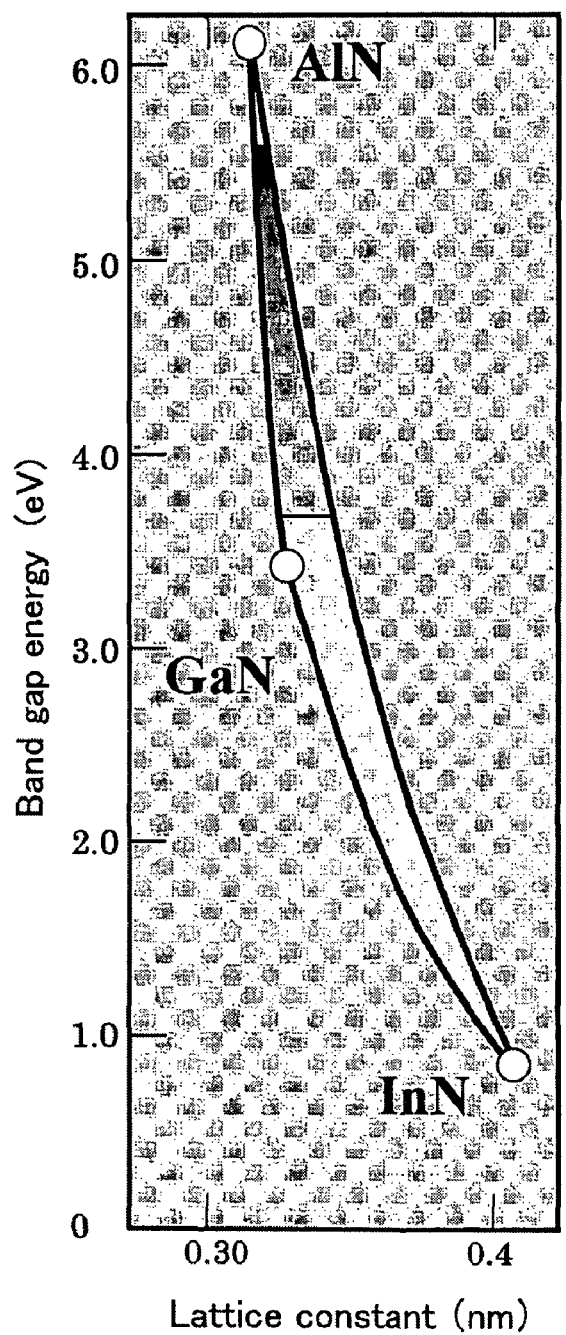

FIG. 13 shows an EL spectrum characteristic of the LED element described above. As shown in FIG. 13, at room temperature, a peak appears at a wavelength of about 351 nm, and the maximum power is 1.95 mW. In the absence of the TMAl layer, the maximum power is about 1.14 mW. Thus, the power is significantly improved.

As described above, according to this embodiment, a high-quality AlGaN buffer for an ultraviolet LED can be produced by introducing a pulsed-supplied TMAl layer. The pulsed supply of TMAl enables the group III polarity to be achieved.

Furthermore, it is confirmed that the pulsed supply of TMAl advantageously reduces the threading dislocation (reduces TDD by about half). Furthermore, by using the pulsed-supplied TMAl template, the maximum power is raised about 1.71 times (from 1.14 mW to 1.95 mW), and the performance is improved.

In the above embodiment, as an example of the device having an InAlGaN compound layer on a sapphire substrate whose property is improved by introducing the pulsed-supplied TMAl layer, an LED has been described. However, of course, the pulsed-supplied TMAl layer can improve the property of other optical devices and electronic devices. In addition, the present invention can also be applied to other group III-V compounds including group III nitrides.

The present invention can be applied to an InAlGaN-based optical device.

What is claimed is:

1. A method of forming a semiconductor structure, comprising:
    a step including a first period in which a group III source and a group V source are supplied to a substrate, a second period in which supply of the group III source and the group V source is stopped, a third period in which only the group III source is supplied and the group V source is not supplied, and a period in which said second and third periods are repeated to form a polarity control layer to control the polarity of the surface to be inverted to a group III polarity, and forming a photonic semiconductor device structure on the polarity control layer.

2. A method of forming a semiconductor structure according to claim 1, wherein said polarity controlling layer has a structure in which a threading dislocation extending from the bottom turns around in the vicinity of the interface with said second group III-V layer.

3. A method of forming a semiconductor structure, comprising:
    a step including a first period in which a first Al source, a Ga source, and a N source are supplied to a substrate, a second period in which supply of all the sources is stopped, a third period in which only a second Al source is supplied, and a period in which said second and third periods are repeated to form a polarity control layer to control the polarity of the surface to be an Al polarity, and forming a photonic InAlGaAs semiconductor device structure on the polarity control layer.

4. A method of forming a semiconductor structure according to claim 3, wherein said polarity controlling layer has a structure in which a threading dislocation extending from the bottom turns around in the vicinity of the interface with said second group III-V layer.

5. A method of forming a semiconductor structure, comprising:
    a step including a first period in which a first Al source, a Ga source, and a N source are supplied to a sapphire substrate, a second period in which supply of all the sources is stopped, a third period in which only a second Al source is supplied, and a period in which said second and third periods are repeated to form a polarity controlling layer having a surface controlled to have an Al polarity.

6. The method of forming a semiconductor structure according to claim 5, further comprising:
    a step of forming an AlN buffer layer between said sapphire substrate and said polarity controlling layer at high temperature.

7. The method of forming a semiconductor structure according to claim 5, wherein there are a first Al source which supplies Al in the second period and a second Al source which supplies Al in the third period.

* * * * *